Figure 1:
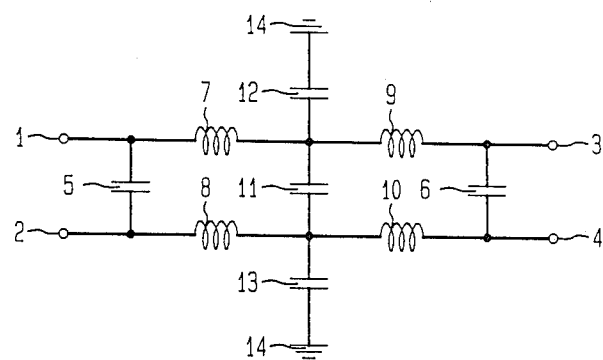

United States Patent [19]
Pardini

[11] Patent Number: 4,777,458
[45] Date of Patent: Oct. 11, 1988

[54] THIN FILM POWER COUPLER

[75] Inventor: Rossano Pardini, Caponago, Italy

[73] Assignee: GTE Telecomunicazioni S.p.A., Cassina de Pecchi, Italy

[21] Appl. No.: 846,773

[22] Filed: Mar. 31, 1986

[30] Foreign Application Priority Data

Apr. 2, 1985 [IT] Italy ............................. 20197 A/85

[51] Int. Cl.$^4$ ................................................ H01P 5/18
[52] U.S. Cl. ..................................... 333/112; 333/116
[58] Field of Search ............................. 333/112, 116

[56] References Cited

U.S. PATENT DOCUMENTS

| | | | |
|---|---|---|---|
| 3,452,300 | 6/1969 | Cappucci et al. | 333/112 |
| 3,484,724 | 12/1969 | Podell | 333/112 |
| 3,593,208 | 7/1971 | Smith | 333/112 |
| 3,869,585 | 3/1975 | Snyder | 333/112 X |
| 3,999,150 | 12/1976 | Caragliano et al. | 333/116 |
| 4,216,446 | 8/1980 | Iwer | 333/112 |

FOREIGN PATENT DOCUMENTS

| | | | |
|---|---|---|---|
| 2457644 | 3/1975 | Fed. Rep. of Germany | 333/116 |
| 0051445 | 4/1979 | Japan | 333/116 |
| 0025817 | 3/1981 | Japan | 333/112 |

Primary Examiner—Eugene R. LaRoche
Assistant Examiner—Seung Ham
Attorney, Agent, or Firm—David N. Caracappa

[57] ABSTRACT

A thin film power coupler, in particular, a 3 dB and 90 degree power divider, is fabricated of lumped circuit elements. The main characteristics of the coupler is in having achieved the coupled inductances by mutual induction. Such an achievement has been obtained with 2 microstrip lines facing each other and wrapped in a square shaped spiral. Another important characteristic of the power coupler is the presence of a capacitor in the circuit which joins the two branches of the coupler, with sufficient tolerance to obtain the wanted coupling and to recover possible tolerances incurred by manufacturing the thin film inductors.

14 Claims, 2 Drawing Sheets

THIN FILM POWER COUPLER

DESCRIPTION

The present invention relates to a thin film power coupler with lumped circuit elements, comprising inductors and capacitors.

It is known that in the microwave receivers and transmitters of radio-links equipment, incoming and outgoing signal converters are used and those converters include intermediate frequency circuits with power dividers or power adders or power couplers in general.

It is also known that in the microwave frequency range the microstrip line power couplers can be achieved by thin film technology. The dimensions of such circuits are related with the central working frequency and they increase when decreasing the frequency. For intermediate frequencies, about 70 to 140 MHz, those dimensions become unallowable, then circuits with lumped elements are necessary.

The power couplers achieved by discrete circuit elements generally have good performance, but they are very expensive and above all they cause problems in connecting them with the other parts of the circuit, when the latter has been achieved by thin film technology. The power couplers achieved by thin film technology and lumped circuit elements instead occupy a lot of space and have inadequate performance, compelling to use the devices in a very narrow band about the central working frequency or in very unbalanced operations.

It is an object of the present invention to avoid the above said drawbacks and to indicate a thin film power coupler, particularly a 3 dB and 90° intermediate frequency power divider with lumped circuit elements, which has a good performance in a sufficiently broad band about the central working frequency, which takes up little space, which is reliable and not very expensive.

In order to obtain the above said object the present invention refers to a thin film power coupler with lumped circuit elements, comprising inductors and capacitors, characterized in that at least a first and a second inductor are magnetically coupled to each other.

Figure 3:
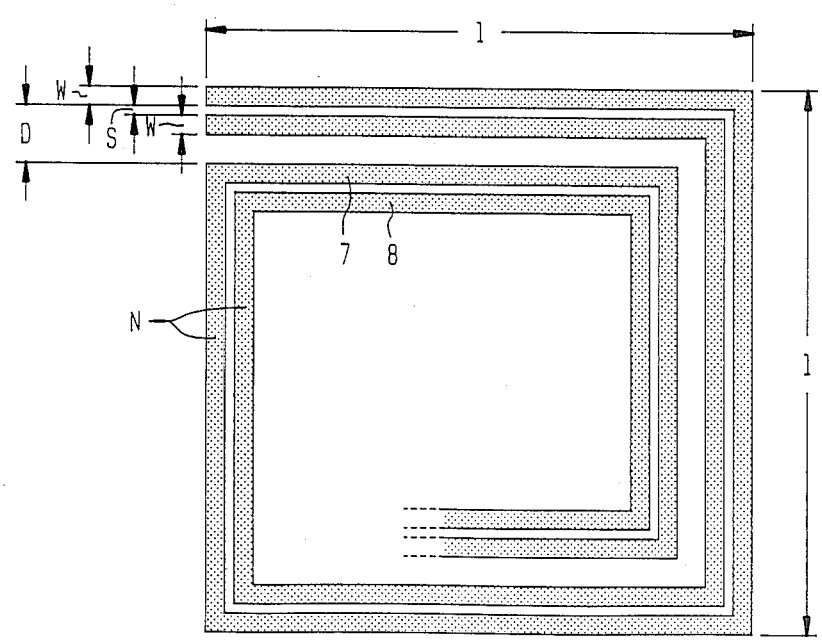
Figure 2:
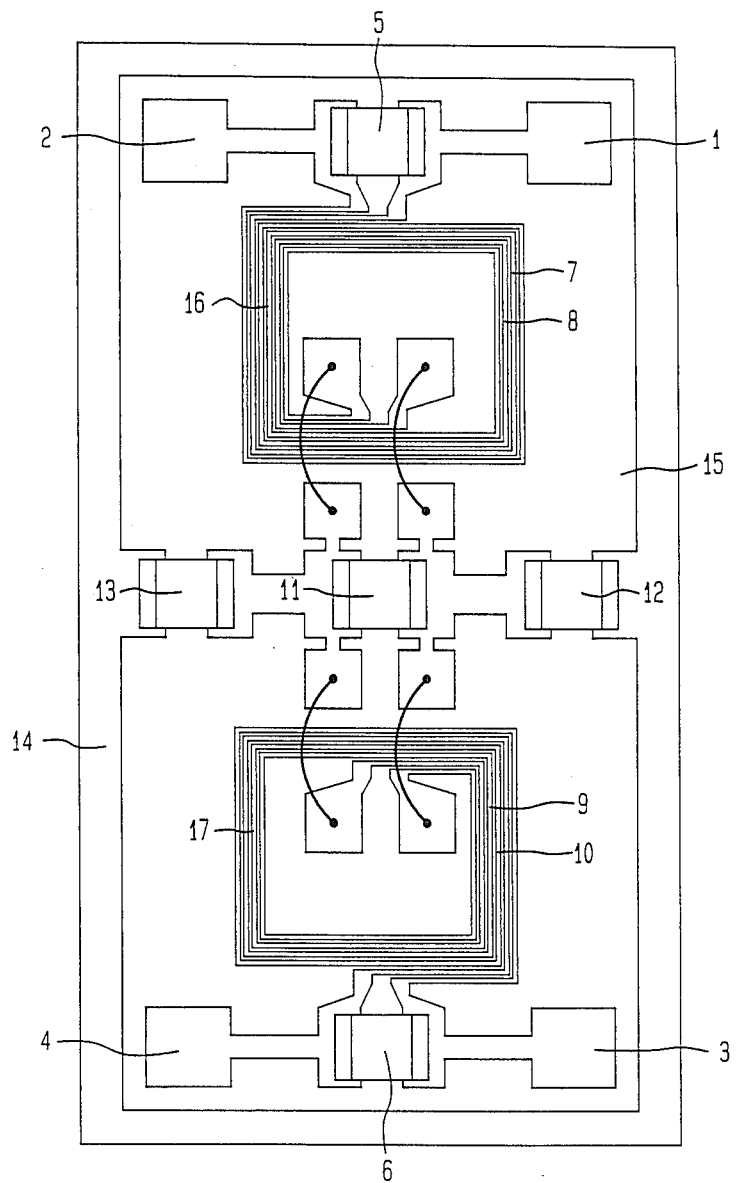

Other objects and advantages of the present invention shall be clear from the following detailed description of a preferred embodiment and from the attached drawings given only as explicating not limiting examples, where:

FIG. 1 shows an electrical diagram of a power divider according to the present invention, FIG. 2 shows a view from above of a thin film embodiment of the FIG. 1 circuit and FIG. 3 shows a detail of FIG. 2.

Referring to FIG. 1, we notice four ports 1,2,3 and 4. A capacitor 5 is connected between the ports 1 and 2, while a capacitor 6 is connected between the ports 3 and 4. A terminal of an inductor 7 is also connected to the port 1, while a terminal of an inductor 8 is also connected to the port 2. A terminal of an inductor 9 is also connected to the port 3, while a terminal of an inductor 10 is also connected to the port 4. The other two terminals of the inductors 7 and 9 are connected to each other, forming a first branch of the circuit, to a terminal of a capacitor 11 and to a terminal of a capacitor 12. The other two terminals of the inductors 8 and 10 are connected to each other, forming a second branch of the circuit, to the other terminal of the capacitor 11 and to a terminal of a capacitor 13. The other two terminals of the capacitors 12 and 13 are put to a ground 14.

The capacitors 5 and 6 have the same value and the capacitors 12 and 13 have the same value too. The four inductors 7,8,9 and 10 also have the same value, moreover, the inductors 7 and 8 are coupled to each other by mutual inductance, the same as it happens for the inductors 9 and 10.

In FIG. 2, in which the same components of FIG. 1 are indicated with the same numbers, are described only the essential elements to the understanding of the present invention. In said figure we notice that the four inductors 7,8,9 and 10 are obtained on a first surface of an insulating support 15 with the thin film technology. The inductors 7 and 8 are gained by using two microstrip lines facing each other, forming a square shaped spiral 16 and in this way they are magnetically coupled to each other. In same way the inductors 9 and 10 are also gained by using two microstrip lines facing each other, forming a square shaped spiral 17 and in this way they are also magnetically coupled to each other too. Moreover, contrary to what is usually done in the thin film circuits, in the area corresponding to the inductors 7,8,9 and 10 the second surface of the support 15, not shown in the figure, is lacking in ground layer to avoid the effects of the unwanted capacitance of the same inductors.

This achievement is a particular advantage in that it allows a very good magnetic coupling for each of the two inductors pairs 7-8 and 9-10 and a very good space utilization. In fact adopting the square shape we obtain a ratio between the inductance value and the surface taken up much higher compared with circular or elliptic shapes. Moreover, by facing each other the two inductors we obtain, in addition to the better magnetic coupling, two inductors in a surface normally taken up by only one inductor, with a considerable space saving.

In a first change of the embodiment of the invention the spiral can be gained by using a circular shape and in a second change with an elliptic shape.

In FIG. 3, in which the same elements of the preceding figures are indicated with the same numbers, "l" indicates the length of the outer side of the square-shaped spiral, "w" indicates the width of the microstrip lines, "s" indicates the distance between the two microstrip lines, "D" indicates the distance between two adjacent coils and "N" indicates the number of coils.

In the preceding figures a power divider has been described, but the circuit can be utilized also as adder circuit or more generally as power coupler by appropriately dimensioning the components.

The component dimensioning has been carried out to obtain a 3 dB and 90° power divider working with 70 MHz central frequency in such a way that in the 50–90 MHz frequency band it works in maximum 1 dB unbalanced operation.

Starting from said specification the power divider parameters can vary between the following values: "l" from 5 to 10 mm; "w" from 0.05 to 0.2 mm; "s" from 0.01 to 0.1 mm; "D" from 0.1 to 0.5 mm and "N" from 2 to 5.

Referring to the preceding figures, the operation of the device is that well known of a 3 dB and 90° power divider, in which by matching conditions the input signal comes to the port 1, a half of the input signal comes out from the port 2, called "coupled port", a half of the input signal comes out from the port 3 called "direct port" and no signal comes out from the port 4, called "insulated port". Moreover, the signals coming out from the ports 2 and 3 are 90° out of phase with each other.

The capacitor 11 allows to improve the electric coupling between the first and the second branch of the power divider and to recover possible tolerances incurred by manufacturing the thin film inductors.

Advantages of the thin film power coupler, object of the present invention, are clear. In particular they result in that such coupler has been achieved by thin film technology, it is integrated on the same support with the remaining circuit, it is reliable, it is not very expensive, it takes up little space, it has very good performance and it can be used either as power divider or as power adder.

It is also clear that many modifications are possible to the described power coupler by a skilled in the art without departing from the scope of the present invention.

What is claimed is:

1. A thin film power coupler with lumped circuit elements, comprising:
    a support having first and second surfaces;
    a first and a second inductor fabricated on the first surface of said support and magnetically coupled to each other by using a first pair of microstrip lines facing each other and coiled, forming a first spiral;
    a third and a fourth inductor fabricated on the first surface of said support and magnetically coupled to each other by using a second pair of microstrip lines facing each other and coiled forming a second spiral; and
    a capacitor fabricated on the first surface of said support; wherein:
    said first inductor is coupled to said third inductor, forming a first branch of the coupler, said second inductor is coupled to said fourth inductor, forming a second branch of the coupler, and said capacitor is coupled between the connection point of said first and third inductor and the connection point of said second and fourth inductor; and
    a ground layer on at least one surface of said support; the second surface of such support is lacking in a ground layer in the area corresponding to that of the inductors.

2. The thin film power coupler according to claim 1, wherein said first spiral is square-shaped.

3. The thin film power coupler according to claim 1, wherein said first spiral is circular-shaped.

4. The thin film power coupler according to claim 1, wherein said first spiral is elliptic-shaped.

5. The thin film power coupler according to claim 1, wherein the distance between said first pair of microstrip lines has a value between 0.01 mm and 0.1 mm.

6. The thin film power coupler according to claim 1, wherein the number of coils of said first spiral is between 2 and 5.

7. The thin film power coupler according to claim 1, wherein said second spiral is square-shaped.

8. The thin film power coupler according to claim 1, wherein said second spiral is circular-shaped.

9. The thin film power coupler according to claim 1, wherein said second spiral is elliptic-shaped.

10. The thin film power coupler according to claim 1, wherein the distance between said second pair of microstrip lines has a value between 0.01 mm and 0.1 mm.

11. The thin film power coupler according to claim 1, wherein the number of coils of said second spiral is between 2 and 5.

12. The thin film power coupler according to claim 1, wherein the value of said capacitor is such as to obtain the desired coupling between said first and second branch of the coupler and to recover possible tolerances incurred by manufacturing said inductors.

13. The thin film power coupler according to any one of claims 1–12, wherein the values of said inductors and of said capacitors are such as to have said coupler perform as a power divider.

14. The thin film power coupler according to any one of claims 1–12, wherein the values of said inductors and of said capacitors are such as to have said coupler perform as a power adder.

* * * * *